United States Patent [19]
Kawabata et al.

[11] Patent Number: 5,261,986
[45] Date of Patent: Nov. 16, 1993

[54] METHOD OF FABRICATING CERAMIC LAMINATED ELECTRONIC COMPONENT

[75] Inventors: Shoichi Kawabata; Hiromichi Wakatsuki; Norio Sakai; Keiichi Okada, all of Nagaokakyo, Japan

[73] Assignee: Murata Manufacturing Co., Ltd., Japan

[21] Appl. No.: 799,043

[22] Filed: Nov. 26, 1991

[30] Foreign Application Priority Data

Nov. 30, 1990 [JP] Japan .................................. 2-339277

[51] Int. Cl.$^5$ ............................................. C04B 37/00
[52] U.S. Cl. ....................................... 156/235; 156/89; 156/241; 156/277; 156/300
[58] Field of Search ................. 156/89, 196, 538, 277, 156/235, 241, 300; 264/500, 510, 544, 553, 554; 427/96

[56] References Cited

U.S. PATENT DOCUMENTS 5,174,842 12/1992 Hamuro et al. ...................... 156/89

FOREIGN PATENT DOCUMENTS 0235427 9/1987 European Pat. Off. .
2228368 8/1990 United Kingdom .
2246020 1/1992 United Kingdom .

Primary Examiner—Jan H. Silbaugh
Assistant Examiner—Christopher A. Fiorilla
Attorney, Agent, or Firm—Ostrolenk, Faber, Gerb & Soffen

[57] ABSTRACT

A method of fabricating a ceramic laminated electronic component including the steps of preparing a plurality of ceramic green sheets each having electrode pastes in a plurality of regions and having positioning marks printed in positions having a constant positional relationship to the electrode pastes, removing wrinkles in each of the ceramic green sheets to flatten the ceramic green sheet on a suction plate, and transferring the flattened ceramic green sheet to a laminating stage by a suction chuck, laminating the ceramic green sheet on the laminating stage on the basis of the above positioning marks, and preliminarily fixing the ceramic green sheets to each other in the case of the lamination in obtaining a mother ceramic laminated body for the ceramic laminated electronic component.

7 Claims, 5 Drawing Sheets

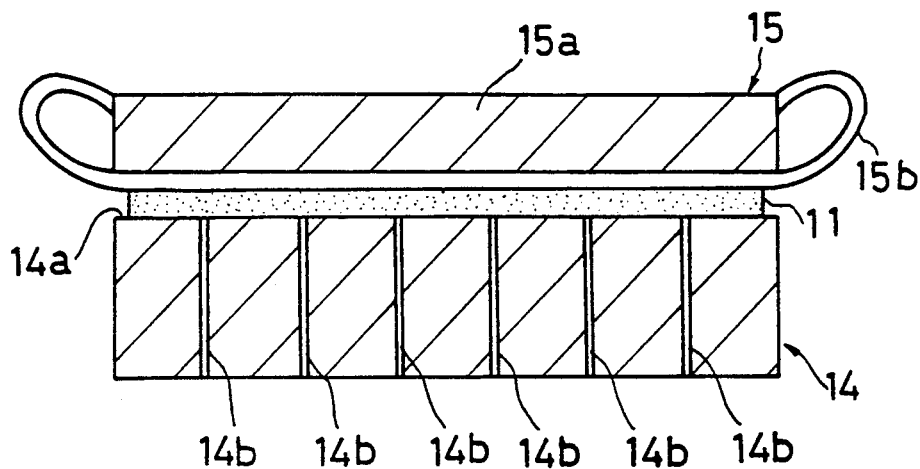
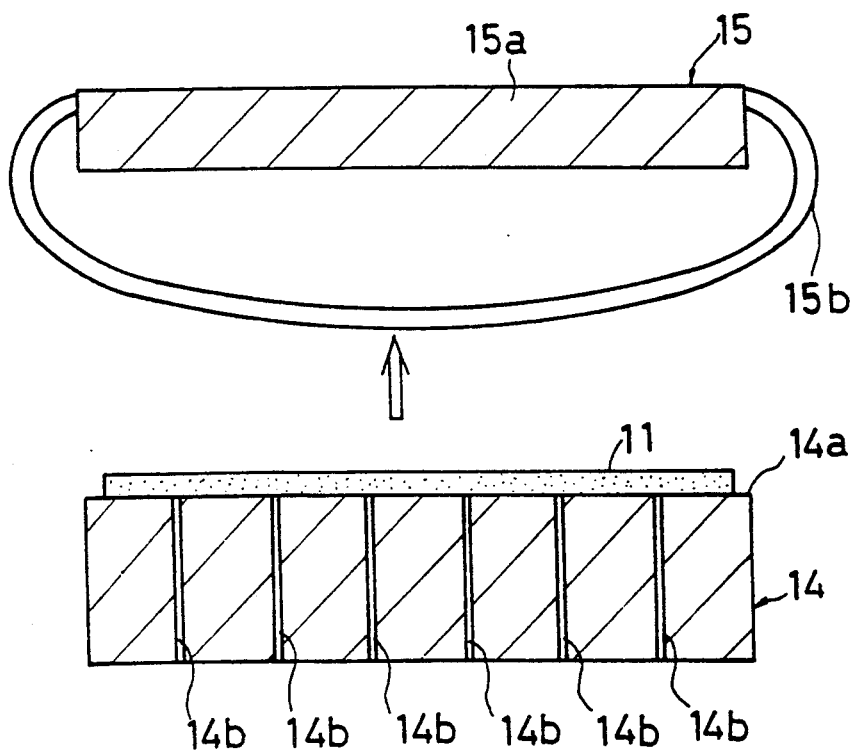

METHOD OF FABRICATING CERAMIC LAMINATED ELECTRONIC COMPONENT

BACKGROUND OF THE INVENTION

1. Field of the Invention

The present invention relates generally to a method of fabricating a ceramic laminated electronic component such as a multilayer capacitor, and more particularly, to a method of fabricating a ceramic laminated electronic component having an improved step of laminating a plurality of ceramic green sheets each having electrode pastes printed thereon.

2. Description of the Prior Art

In fabricating a multilayer capacitor, a mother ceramic green sheet having electrode pastes printed in a plurality of regions is always used so as to increase productivity. More specifically, a plurality of mother ceramic green sheets are then laminated and are pressed in the direction of their thickness to obtain a mother laminated body. This mother laminated body is then cut in the direction of the thickness, to obtain a number of laminated bodies. In addition, the laminated bodies obtained are fired and provided with outer electrodes to obtain a number of multilayer capacitors.

However, in the above described mother laminated body, the upper and lower electrode pastes must be accurately overlapped with each other in the direction of the thickness; otherwise when the mother laminated body is cut in the direction of the thickness to obtain the respective laminated bodies for multilayer capacitors it is possible that the capacitance desired may not be obtained, or that the electrodes may be exposed at end surfaces of the laminated bodies so that insulation failure occurs. Accordingly, to obtain the above described mother laminated body, a plurality of ceramic green sheets have conventionally been laminated on the basis of the end surfaces of the laminated body, that is the, edges of the respective ceramic green sheets.

In the conventional fabricating method, however, a laminated body in which electrode pastes are accurately overlapped with each other in the direction of thickness cannot be obtained for the following reasons:

(a) First, the ceramic green sheets may be wrinkled, or a printing pattern of the electrode pastes may be changed due to a variation in the printing process of the electrode pastes and the elapse of time, so that electrode pastes 3a to 3c (in FIG. 2) and electrode pastes 4a to 4c, respectively printed on the upper surfaces of the mother ceramic green sheets 1 and 2, may, in some cases, be shifted, as shown in the schematic cross sectional view of FIG. 2. That is, even if the mother ceramic green sheets 1 and 2 (shown in FIG. 2) are laminated after being lined up with high precision, the electrode pastes 3a to 3c and the electrode pastes 4a to 4c cannot be accurately overlapped with each other because they are not positioned with precision; as shown in FIG. 2.

(b) Furthermore, when electrode pastes 6a to 6c (in FIG. 3) are printed and dried in a plurality of regions on a mother ceramic green sheet 5, the mother ceramic green sheet 5 is liable to warp in the vicinity of edges 5a and 5b after drying, as shown in the cross sectional view of FIG. 3. As a result, even if a plurality of ceramic green sheets are lined up on the basis of the edges of the mother ceramic green sheet 5, that is, the end surfaces of the laminated body, the electrode pastes formed on the respective ceramic green sheets cannot be accurately overlapped with each other in the direction of the thickness due to the variation in the degree to which the respective ceramic green sheet warp, as described above.

(c) In laminating a plurality of ceramic green sheets on the basis of their edges, that is, the end surfaces of the laminated body, a metallic mold 7, as shown in cross sectional view of FIG. 4, is used. More specifically, a plurality of ceramic green sheets 8a to 8f are put into a recess portion 7a of the metallic mold 7 and are abutted on an inner wall 7b or 7c with the metallic mold 7 being vibrated, to line up the edges of the ceramic green sheets.

However, the thickness of the respective ceramic green sheets 8a to 8f is approximately 10 to 30 μm, and tends to be made smaller with larger capacity. Consequently, the ceramic green sheets are very thin and have no flexibility. Accordingly, in lining up the ceramic green sheets 8a to 8f by vibrating the metallic mold 7, the ceramic green sheets 8a to 8f may be broken, so that a desired laminated body cannot, in some cases, be obtained.

(d) Moreover, in order to make it easy to put the ceramic green sheets 8a to 8f into the recess portion 7a of the metallic mold 7, the width of the recess portion 7a is generally made slightly larger than the width of the ceramic green sheets 8a to 8f. Consequently, in the step previous to the step of lining up the ceramic green sheets on the basis of the edges, the ceramic green sheets 8a to 8f are liable to be laminated in a shifted state, as shown in FIG. 4.

For the foregoing reasons, in the conventional method the ceramic green sheets are not accurately laminated in the mother laminated body. As a result, in a multilayer capacitor 9 (in FIG. 5) finally obtained, an upper inner electrode 10a and a lower inner electrode 10b may not, in some cases, be accurately overlapped with each other, as shown in the cross sectional plan view of FIG. 5. Consequently, it is difficult to obtain desired capacitance. In addition, the width x of a side margin region must be made larger than necessary so as to prevent insulation failure, which prevents obtaining a smaller size capacitor and larger capacitance. In FIG. 5, reference numeral 11 denotes a sintered body, and reference numerals 12a and 12b denote outer electrodes.

Although the above description was made of a multilayer capacitor by way of example, the same problems occur in various other ceramic laminated electronic components in which inner electrodes are laminated while being separated by ceramic layers, for example, a laminated LC composite component.

SUMMARY OF THE INVENTION

An object of the present invention is to provide a method of fabricating a ceramic laminated electronic component comprising the step which allows a plurality of ceramic green sheets each having electrode pastes printed thereon to be laminated with high precision.

The present invention provides a method of fabricating a ceramic laminated electronic component, comprising the steps of preparing ceramic green sheets each having electrode pastes printed in a plurality of regions and having positioning marks printed in positions having a constant positional relationship to the above electrode pastes; mounting each of the above ceramic green sheets on a suction plate and removing wrinkles in the mounted ceramic green sheet to flatten the ceramic green sheet on the suction plate; holding the flattened ceramic green sheet in a suction chuck and transferring the ceramic green sheet to a laminating stage by the suction chuck; laminating the flattened ceramic green sheet on the laminating stage on the basis of the positioning marks and preliminarily fixing the ceramic green sheets to each other in the case of the lamination.

The fabricating method according to the present invention comprises the step of applying suction to the ceramic green sheet as well as removing wrinkles in the ceramic green sheet to flatten the ceramic green sheet on the suction plate, thereby reliably removing the wrinkles in the ceramic green sheet due to the variation in the drying state of the ceramic green sheet and the electrode pastes.

Furthermore, the ceramic green sheet is laminated on the laminating stage utilizing the positioning marks, thereby laminating a plurality of ceramic green sheets in a state where electrode pastes are accurately overlapped with each other in the direction of thickness.

Additionally, the ceramic green sheets accurately laminated on the basis of the positioning marks are preliminarily fixed to each other, thereby maintaining the ceramic green sheets in a accurately overlapped state until the ceramic green sheets are fired.

According to the present invention, therefore, it is possible to obtain a ceramic laminated body in which electrode pastes are accurately overlapped with each other, so as to provide a multilayer capacitor and various ceramic laminated electronic components in which the variation in capacitance, insulation failure and the like do not easily occur.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a cross sectional view showing a state where a wrinkle pressing member is applied on a ceramic green sheet to flatten the ceramic green sheet;

FIG. 9 is a cross sectional view showing a state where the wrinkle pressing member is raised subsequently to the step shown in FIG. 8;

DESCRIPTION OF THE PREFERRED EMBODIMENTS

The present invention will be made clear by describing the following embodiments.

Figure 6:
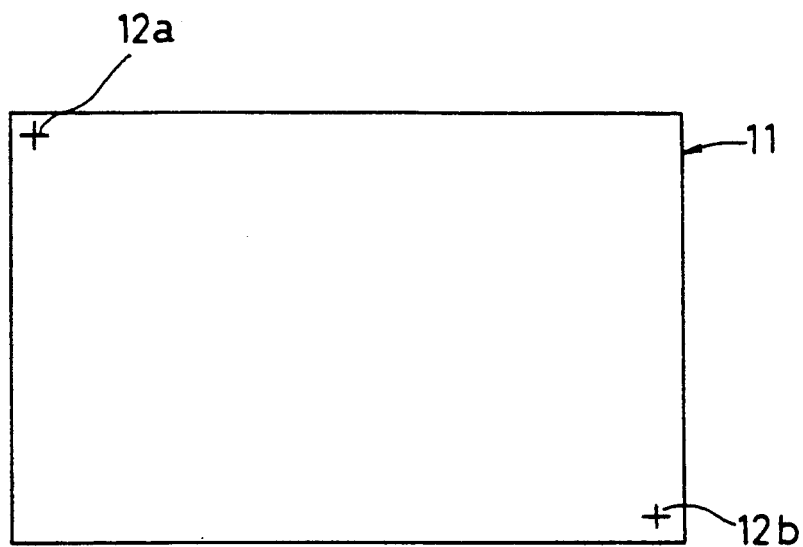
FIG. 6 is a plan view showing a mother ceramic green sheet having positioning marks prepared in the present embodiment of the invention.

First, a ceramic slurry is formed, and a ceramic green sheet thereby obtained is cut to a predetermined size by punching, to obtain a mother ceramic green sheet 11 shown in FIG. 6. A plurality of positioning marks 12a and 12b are printed on one major surface of the ceramic green sheet 11.

Figure 7:
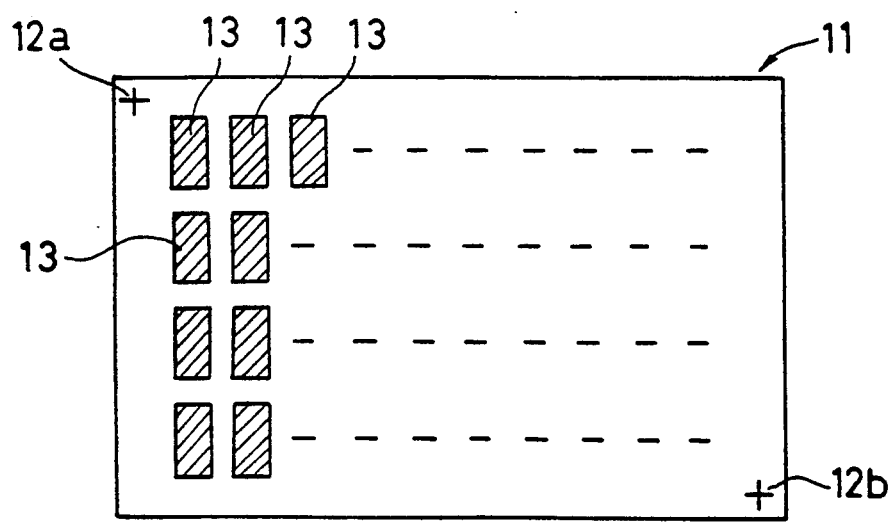
FIG. 7 is a plan view showing a ceramic green sheet having electrode pastes printed thereon.

As shown in the plan view of FIG. 7, electrode pastes 13 are printed in a plurality of regions and dried on one major surface of the ceramic green sheet 11. In this case, the electrode pastes 13 are printed in regions having a predetermined positional relationship to the positioning marks 12a and 12b.

The above described electrode pastes 13 may be printed in the same step as printing of the positioning marks 12a and 12b, or the positioning marks 12a and 12b may be printed after the electrode pastes 13 are printed in the plurality of regions.

Furthermore, the plane shape of the positioning marks 12a and 12b is not limited to a cross shape as shown. For example, they may be of any desired shape such as a circular or polygonal shape. Similarly, the positioning marks 12a and 12b need not be printed in the vicinity of corner portions which are opposed to each other of the ceramic green sheet 11 as shown. The positioning marks 12a and 12b may be formed in at least two regions in the vicinity of the peripheral ends of the ceramic green sheet 11.

Figure 1:
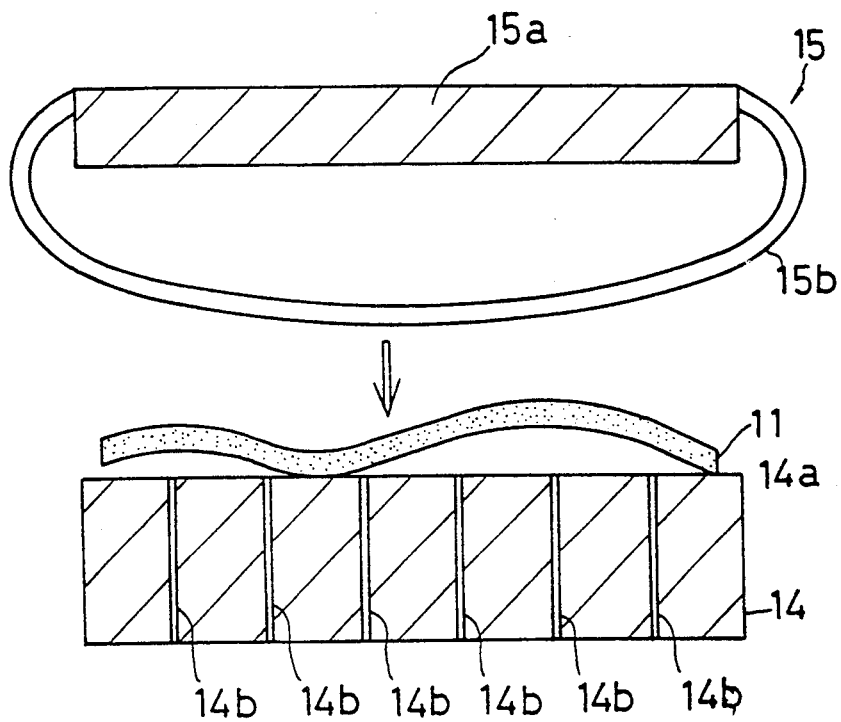
FIG. 1 is a cross sectional view of the step of flattening a ceramic green sheet in a fabricating method according to one embodiment of the present invention.
Figure 2:
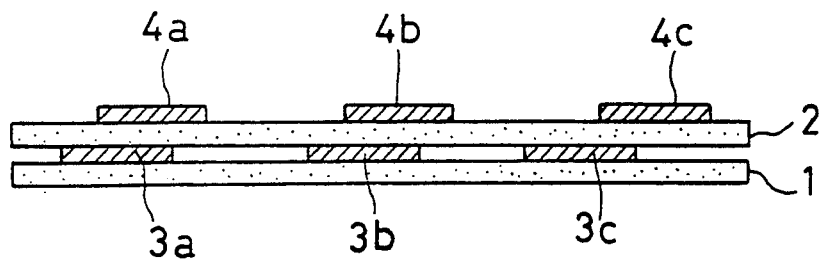
FIG. 2 is a cross sectional view showing a state where electrode pastes on ceramic green sheets are shifted in a conventional fabricating method.
Figure 3:
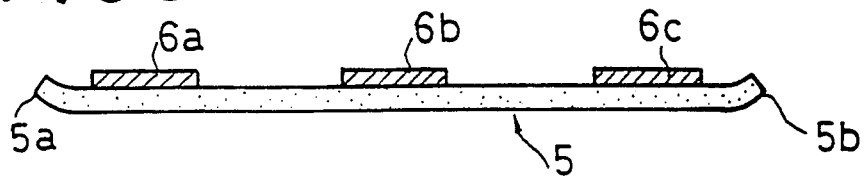
FIG. 3 is a cross sectional view showing a state where a ceramic green sheet warps.
Figure 4:
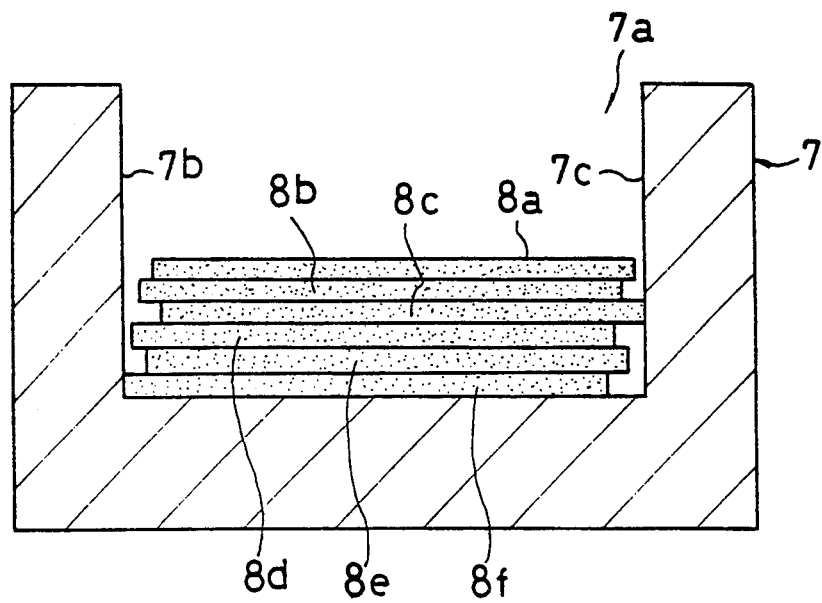
FIG. 4 is a cross sectional view showing a state where a plurality of ceramic green sheets are shifted sideward in a metallic mold in the conventional method.
Figure 5:
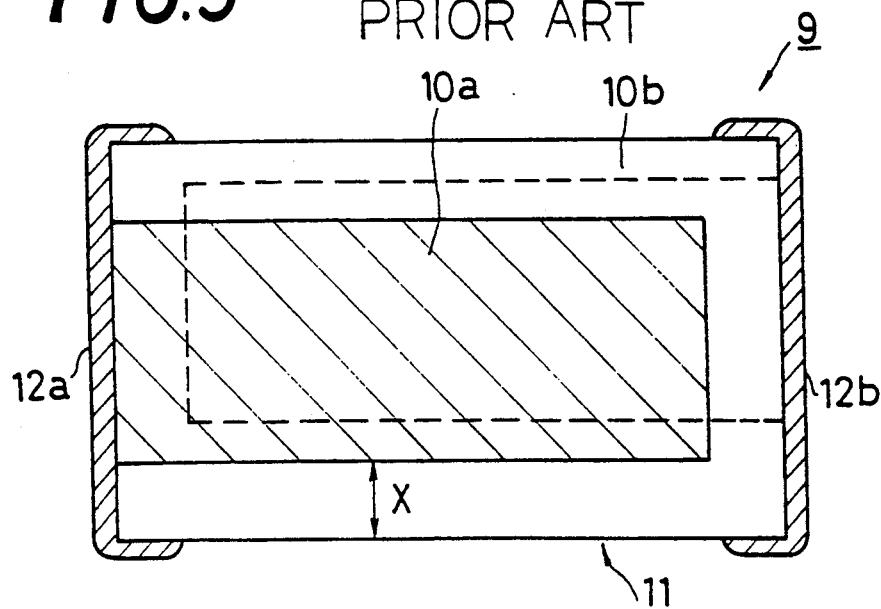
FIG. 5 is a schematic cross sectional plan view showing a multilayer capacitor obtained in the conventional method.

The ceramic green sheet 11 having the positioning marks 12a and 12b and the electrode pastes 13 printed thereon is mounted on a suction plate 14, as shown in FIG. 1. The suction plate 14 has a plurality of through holds 14b which to an upper surface 14a. The through holes 14b are connected to suction means (not shown), for example, a vacuum pump and are formed so as to apply suction and fix the ceramic green sheet 11 on the upper surface 14a.

In many cases, the ceramic green sheet 11 having the positioning marks 12a and 12b and the electrode pastes 13 printed thereon has wrinkles as shown depending on the degree to which the positioning marks 12a and 12b and the electrode pastes 13 are dried. This phenomenon becomes significant as the ceramic green sheet 11 becomes thinner.

In the present embodiment, the above wrinkles are removed using a sheet pressing member 15 serving as wrinkle removing means disposed above the suction plate 14. The sheet pressing member 15 comprises a pressing plate 15a and a film 15b having flexibility. The film 15b is made of a material of synthetic resin such as polyethylene terephthalate or polypropylene and is constructed in the form of an annular member connecting both ends of the pressing plate 15a as shown. Since the film 15b is provided so as to flatten the ceramic green sheet 11, it must be formed to a thickness having a certain degree of flexibility.

In flattening the ceramic green sheet 11, the above sheet pressing member 15 is lowered in a direction indicated by the arrow in FIG. 1.

As the sheet pressing member 15 is lowered, the central part of the film 15b is applied on the upper surface of the ceramic green sheet 11 As the pressing plate 15a is further lowered, the central region, which is applied on the ceramic green sheet 11, of the film 15b is gradually enlarged, so that the ceramic green sheet 11 is flattened, as shown in FIG. 8.

Then, the ceramic green sheet 11 is fixed by suction on the upper surface 14a by applying suction to the ceramic green sheet 11 through the through holes 14b of the suction plate 14.

After the ceramic green sheet 11 is flattened, the sheet pressing member 15 is raised again, as shown in FIG. 9. In such a manner, the ceramic green sheet 11 is flattened so that the wrinkles therein are removed on the suction plate 14.

Although in the present embodiment, the suction plate 14 used for applying suction and fixing the ceramic green sheet 11 has a plurality of through holes 14b formed therein, a perforated plate having a lot of very small holes formed therein may also be used to apply suction to the ceramic green sheet 11 from the side of the lower surface of the perforated plate by suction means.

Furthermore, the above described auction plate may be made of a rigid material such as ceramics and a metal, or may be made of an elastic material such as rubber.

Figure 10:
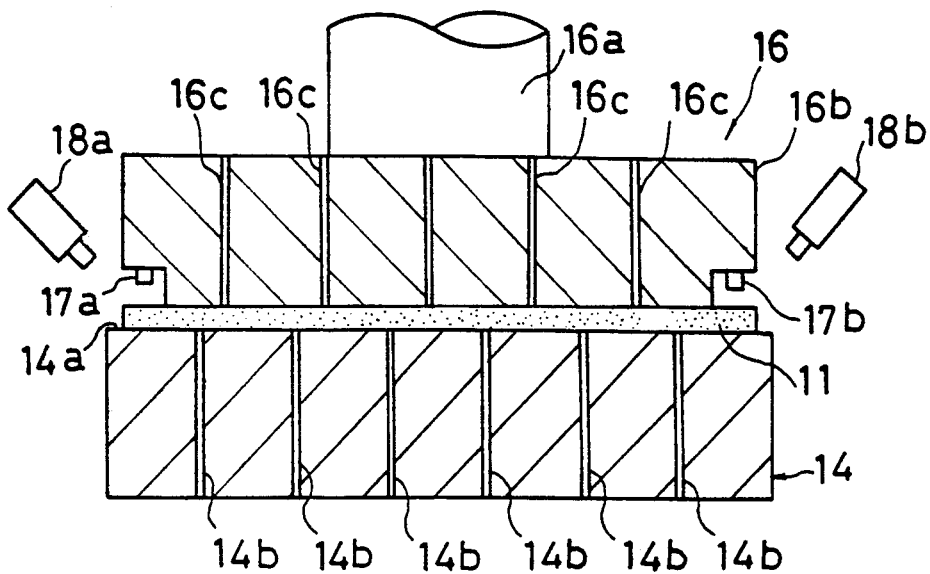
FIG. 10 is a cross sectional view showing a state where a suction chuck is applied on the flattened ceramic green sheet.

The sheet pressing member 15 is then moved sideward and a suction chuck 16 is lowered in place from above the suction plate 14, as shown in FIG. 10. The suction chuck 16 has a rod 16a constructed so as to be movable up and down, and a chuck portion 16b fixed to the lower end of the rod 16a. The chuck portion 16b has its lower surface finished to from a flat surface and has a plurality of suction holes 16c formed therein. The suction holes 16c are connected to suction means (not shown), for example, a vacuum pump.

Additionally, adhesives discharging nozzles 17a and 17b are attached to positions in the vicinity of both side edges of the suction chuck 18 with their openings being directed downward.

The ceramic green sheet 11 mounted on the upper surface of the suction plate 14 is held in the above described suction chuck 18. In this case, a suction operation in the suction chuck 16 is performed, with the lower surface of the suction chuck 16 being applied on the upper surface of the ceramic green sheet 11, and while the suction sucking operation in the suction plate 14 is stopped, so as to apply suction and hold the ceramic green sheet 11 on the lower surface of the chuck portion 16b of the suction chuck 16.

Meanwhile, in when holding the ceramic green sheet 11 by the suction chuck 16, the chuck portion 16b of the suction chuck 16 is applied at an exact position on the upper surface of the ceramic green sheet 11 on the basis of the positioning marks 12a and 12b formed, in the present embodiment, on the upper surface of the ceramic green sheet 11 (see FIG. 6). More specifically, in order to apply the chuck portion 16b of the suction chuck 16 at an exact position on the ceramic green sheet 11, the positioning marks 12a and 12b are read by cameras 18a and 18b, and a position where the suction chuck 16 is lowered is set based on positional information obtained by the cameras 18a and 18b.

Figure 11:
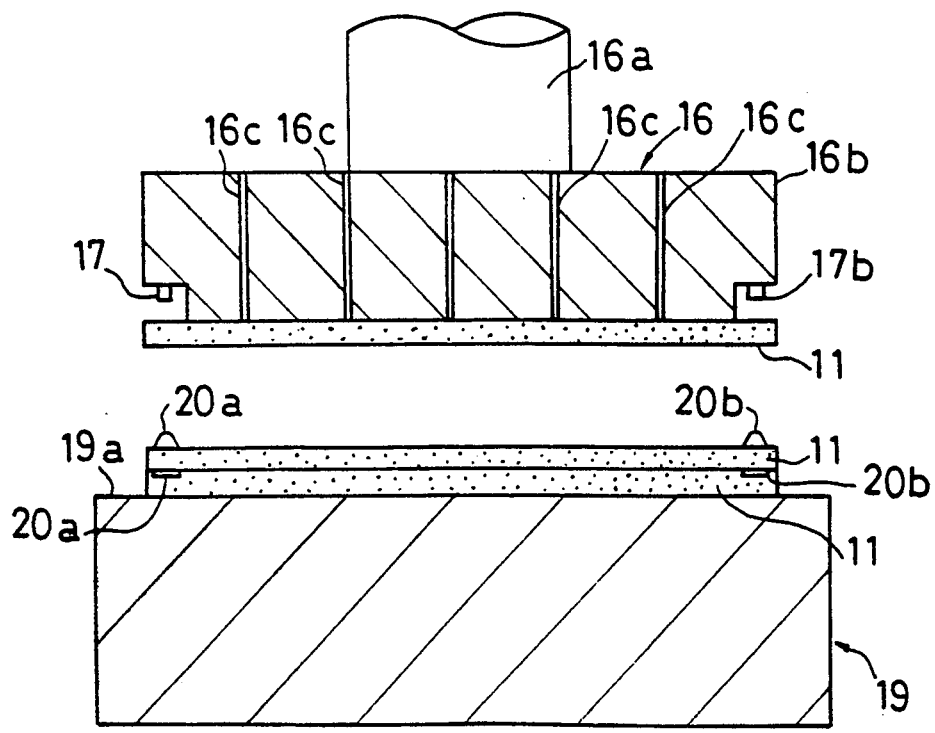
FIG. 11 is a cross sectional view of the step of laminating a ceramic green sheet held in the suction chuck.

The suction chuck 16 is then moved to a position above the suction plate 14, and is further moved sideward with the ceramic green sheet 11 being held by suction on the lower surface of the chuck portion 16b. The suction chuck 16 is transferred to a predetermined position above a laminating stage 19 shown in FIG. 11. Thereafter, the suction chuck 16 is lowered, to laminate the ceramic green sheet 11 on the upper surface 19a of the laminating stage 19 or the upper surface of the ceramic green sheet 11 previously laminated. In the case of the lamination, the suction chuck 16 is lowered until the lower surface of the ceramic green sheet 11 held in the suction chuck 16 is applied on the upper surface 19a of the laminating stage 19 or the upper surface of the ceramic green sheet 11 previously laminated. Thereafter, the suction operation in the suction chuck 16 is stopped.

In the present embodiment, small amounts of adhesives are applied to the upper surface of the ceramic green sheet 11 from the adhesive discharging nozzles 17a and 17b. Finally, the suction chuck 16 is raised so as to be separated from the upper surface of the ceramic green sheet 11.

By repeating the above described series of steps, a plurality of ceramic green sheets 11 can be laminated on the upper surface 19a a of the laminating stage 19. In addition, the plurality of ceramic green sheets 11 are preliminarily fixed to each other by adhesives 20a and 20b discharged from the above adhesive discharging nozzles 17a and 17b. More specifically, in the present embodiment, it is possible to apply suction and hold the ceramic green sheet 11 on the lower surface of the chuck portion 16b of the suction chuck 16 in an exact positional relationship utilizing the positioning marks 12a and 12b (see FIG. 7) having a defined positional relationship to the electrode pastes 13, and to laminate the ceramic green sheet 11 held in this summer in a position where the electrode pastes of the upper and lower ceramic green sheets which are laminated are accurately overlapped with each other on the laminating stage 19. Moreover, the ceramic green sheets 11 laminated in an exact positional relationship are preliminarily fixed to each other by the adhesives 20a and 20b. Consequently, the plurality of ceramic green sheets 11 laminated in an exact positional relationship on the laminating stage 19 are prevented from being shifted sideward in the subsequent steps.

Although in the above described embodiment, the positioning marks 12a and 12b are utilized to position the ceramic green sheet 11 in the suction chuck 16 while held on the suction plate 14, the ceramic green sheets 11 may also be laminated so that the upper and lower electrode pastes are accurately overlapped with each other utilizing the positional information based on the positioning marks 12a and 12b when separating the ceramic green sheet 11 from the suction chuck 16 on the laminating stage 19.

Alternatively, the laminating stage 19 may be moved based on the positional information obtained from the positioning marks 12a and 12b. In short, the positional information based on the positioning marks 12a and 12b is obtained utilizing a pickup device such as the cameras 18a and 18b and a image processing unit (not shown), and at least one of the suction chuck 16 and the laminating stage 19 is placed in an exact position based on the positional information, thereby making it possible to accurately overlap a plurality of ceramic green sheets with each other.

Furthermore, for the adhesives 20a and 20b, used for preliminarily fixing the ceramic green sheets 11 to each other, adhesives containing a solvent which does not dissolve an organic binder in the ceramic green sheet 11 are preferable; otherwise the ceramic green sheet 11 dissolve, and shrink locally when it is dried, which is liable to cause a shift in lamination. Consequently, when the binder in the ceramic green sheet is, for example, water-soluble vinyl acetate, it is preferable to use adhesives containing a solvent such as ethyl cellosolve, butyl cellosolve or toluene.

Additionally, in laminating the ceramic green sheet 11 on the laminating stage 19, the ceramic green sheet 11 may not only be laminated but also pressed by applying downward pressure using the suction chuck 16.

Moreover, although in the above described embodiment, the ceramic green sheets 11 are preliminarily fixed to each other in a laminated state using the adhesives 20a and 20b, the ceramic green sheets 11 may be heat-pressed using the suction chuck 16 or a pressing plate separately placed in place of the adhesives 20a and 20b. This heat-pressing can be achieved by heating the suction chuck 16 and the laminating stage 19 to, for example, a temperature of approximately 50° to 100° C., followed by pressing at a pressure of approximately 10 to 100 kg/cm$^2$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a ceramic laminated electronic component, comprising the steps of:

preparing a plurality of ceramic green sheets, each ceramic green sheet having on a surface thereof electrode pastes printed in a plurality of regions, and positioning marks printed in positions having a constant positional relationship to said electrode pastes;

mounting a first one of said plurality of ceramic green sheets on a suction plate and removing wrinkles in the mounted ceramic green sheet to flatten the mounted ceramic green sheet on the suction plate;

holding the flattened ceramic green sheet in a suction chuck and transferring the held ceramic green sheet from said suction plate to a laminating stage by said suction chuck;

applying the ceramic green sheet to the laminating stage from said suction chuck;

repeating the mounting, holding and transferring steps with a second one of said plurality of ceramic green sheets and laminating said second ceramic green sheet on an upper surface of the previously applied ceramic green sheet on the laminating stage from said suction chuck on the basis of said positioning marks; and repeating the mounting, holding, and transferring steps with each remaining ceramic green sheet of said plurality of ceramic green sheets and laminating each of said remaining ceramic green sheets on an upper surface of a previously laminated ceramic green sheet on said laminating stage from said suction chuck on the basis of said positioning marks;

said laminating step including preliminarily fixing said plurality of ceramic green sheets to each other, wherein the step of removing wrinkles in said mounted ceramic green sheet is carried out by the steps of:

applying suction and fixing the ceramic green sheet on said suction plate, and applying wrinkle removing means for above on an upper surface of said ceramic green sheet; said wrinkle removing means comprising a sheet pressing member having a part which is applied to said ceramic green sheet, said part of said sheet pressing member comprising a film having flexibility.

2. The method according to claim 1, wherein said positioning marks are printed on said ceramic green sheets and then said electrode pastes are printed on the basis of said positioning marks, to obtain said ceramic green sheets each having said electrode pastes and said positioning marks.

3. The method according to claim 1, wherein said electrode pastes are printed on said ceramic green sheets and then said positioning marks are printed in positions having a constant positional relationship to said electrode pastes, to obtain said ceramic green sheets each having said electrode pastes and said positioning marks.

4. The method according to claim 1, wherein said electrode pastes and said positioning marks are printed in the same process, to obtain said ceramic green sheets each having said electrode pastes and said positioning marks.

5. The method according to claim 1, wherein said positioning marks are formed in regions in the vicinity of peripheral ends of said ceramic green sheets.

6. The method according to claim 5, wherein a plurality of said positioning marks, are provided on each green sheet.

7. The method according to claim 1, wherein said ceramic green sheets are preliminarily fixed to each other using adhesives.

* * * * *